United States Patent
Lin et al.

(10) Patent No.: US 11,626,289 B2
(45) Date of Patent: Apr. 11, 2023

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Xi Lin, Shanghai (CN); Sheng Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 16/932,102

(22) Filed: Jul. 17, 2020

(65) Prior Publication Data

US 2021/0020451 A1   Jan. 21, 2021

(30) Foreign Application Priority Data

Jul. 18, 2019   (CN) .......................... 201910649548.1

(51) Int. Cl.
*H01L 21/311*   (2006.01)
*H01L 21/768*   (2006.01)

(52) U.S. Cl.
CPC .. *H01L 21/31116* (2013.01); *H01L 21/76802* (2013.01); *H01L 21/76832* (2013.01); *H01L 21/76834* (2013.01)

(58) Field of Classification Search
None
See application file for complete search history.

(56) References Cited

U.S. PATENT DOCUMENTS 7,977,249 B1* 7/2011 Liu .................. H01L 21/76825
                                                          438/724
2017/0168389 A1* 6/2017 Park ................ H01L 21/31144

* cited by examiner

*Primary Examiner* — Stephanie P Duclair
(74) *Attorney, Agent, or Firm* — Anova Law Group, PLLC

(57) ABSTRACT

A method for forming a semiconductor structure includes providing a substrate, forming a stop layer over a surface of the substrate, forming a dielectric layer over a surface of the stop layer, forming a first opening in the dielectric layer and exposing a portion of the stop layer, modifying the portion of the stop layer exposed at a bottom of the first opening to form a modification layer, and removing the modification layer to form a second opening from the first opening.

12 Claims, 6 Drawing Sheets

SEMICONDUCTOR STRUCTURE AND METHOD FOR FORMING THE SAME

CROSS-REFERENCE TO RELATED APPLICATION

This application claims priority to Chinese Patent Application No. 201910649548.1, filed on Jul. 18, 2019, the entire content of which is incorporated herein by reference.

TECHNICAL FIELD

The present disclosure generally relates to the field of semiconductor manufacturing and, more particularly, relates to semiconductor structures and fabrication methods thereof.

BACKGROUND

The integrated circuit (IC) manufacturing process is often a planar manufacturing process, which combines various processes such as photolithography, etching, deposition, ion implantation, etc., to form a variety of types of complex devices on a same substrate and interconnect the devices to provide complete electronic functions. However, deviation in any step of the manufacturing process may cause circuit performance parameters to depart from designed values. Currently, as the feature size of very-large-scale integration (VLSI) devices continues to scale down proportionally and the integration level continues to increase, higher requirements are placed on the control of each step of the process and the accuracy of the process results.

Therefore, the existing IC manufacturing process may still need to be improved. The disclosed semiconductor structures and fabrication methods thereof are directed to solve one or more problems set forth above and other problems in the art.

SUMMARY

To address the problems described above, embodiments and implementations of the present disclosure provide a semiconductor structure and a method for forming the semiconductor structure.

One aspect of the present disclosure provides a method for forming a semiconductor structure. The method includes providing a substrate, forming a stop layer over the substrate, forming a dielectric layer over the stop layer, forming a first opening in the dielectric layer and exposing a portion of the stop layer, modifying the portion of the stop layer exposed at the bottom of the first opening to form a modification layer, and removing the modification layer to form a second opening from the first opening.

Optionally, a plasma processing process is performed to modify the portion of the stop layer exposed at the bottom of the first opening.

Optionally, the stop layer is made of a material including aluminum nitride, aluminum oxide, or silicon nitride; and the modification layer is made of a material including aluminum or silicon oxide.

Optionally, a processing gas used in the plasma processing process includes a mixed gas of hydrogen and argon, where a volume ratio of hydrogen in the processing gas is greater than 20%; or the processing gas used in the plasma processing process is oxygen.

Optionally, the modification layer is removed by a wet etching process, and an etching solution used in the wet etching process includes a hydroxylamine solution or a hydrogen fluoride solution.

Optionally, the substrate includes a base substrate and an isolation layer disposed over the base substrate; an interconnection structure is provided in the isolation layer; and the isolation layer exposes a portion of the interconnection structure.

Optionally, the second opening exposes the interconnection structure.

Optionally, the interconnection structure is made of a material including a metal, and the metal includes copper, tungsten, cobalt, ruthenium, or a combination thereof.

Optionally, the dielectric layer includes a first dielectric layer located over the stop layer; and a second dielectric layer located over the first dielectric layer. The first opening is formed in the second dielectric layer and the first dielectric layer.

Optionally, the first dielectric layer is made of a material including silicon oxide, silicon nitride, or silicon; and the second dielectric layer is made of a material including silicon oxide, silicon nitride, or silicon.

Optionally, forming the first opening in the first dielectric layer and the second dielectric layer includes forming a patterned mask layer over the second dielectric layer, the patterned mask layer exposing a portion of the second dielectric layer; and forming the first opening by etching the second dielectric layer and the first dielectric layer using the patterned mask layer as an etch mask layer until the stop layer is exposed.

Optionally, a dry etching process is performed to etch the second dielectric layer and the first dielectric layer.

Optionally, the method for forming the semiconductor structure further includes forming a conductive plug in the second opening.

Optionally, a deposition process is performed to form the stop layer.

Optionally, a deposition process is performed to form the dielectric layer.

Correspondingly, another aspect of the present disclosure further provides a semiconductor structure formed by a method according to the present disclosure.

Compared to the existing technology, the technical solution of the present disclosure have the following advantages.

The method of the technical solution of the present disclosure includes modifying the stop layer at the bottom of the first opening to form a modification layer. The modification layer is made of the material having a higher etching selectivity ratio over the material for forming the stop layer, such that the etching process causes less damage to the stop layer on the sidewall of the second opening when removing the modification layer to form a second opening. As such, short circuit and leakage may be avoided after a plurality of conductive plugs is formed in the second openings. Therefore, the performance of the semiconductor structure may be improved.

Further, the modification layer is made of a material including aluminum or silicon oxide. The modification layer may thus have a higher etching selectivity ratio over the stop layer. Therefore, the removal process may have limited damage to the stop layer located on the sidewall of the second opening when removing the modification layer to form the second opening.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

According to the existing technology, the IC manufacturing process needs to be improved to satisfy higher requirements placed on the control of each step of the process and the accuracy of the process results as the feature size of very-large-scale integration (VLSI) devices continues to scale down proportionally. In the following, further analysis and description will be made in combination with some examples.

Figure 1:
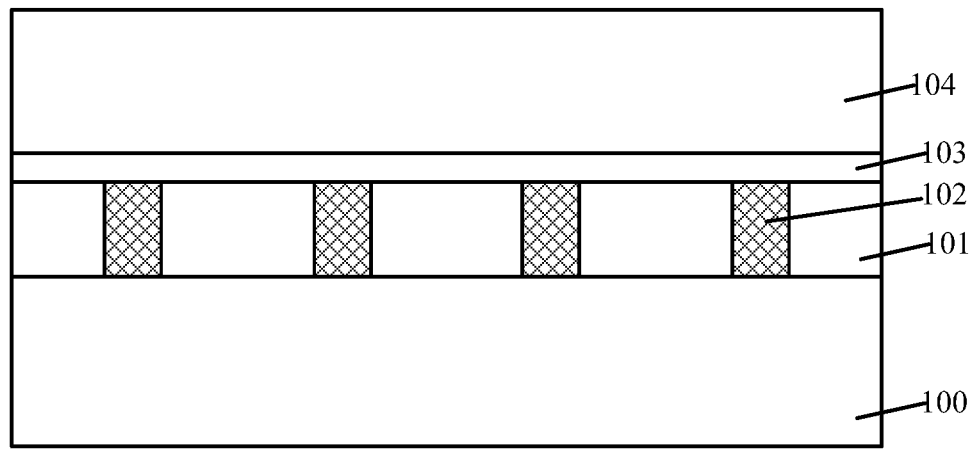
FIG. 1 to FIG. 3 illustrate schematic cross-sectional views of semiconductor structures at certain stages of a fabrication process of a semiconductor structure.
Figure 2:
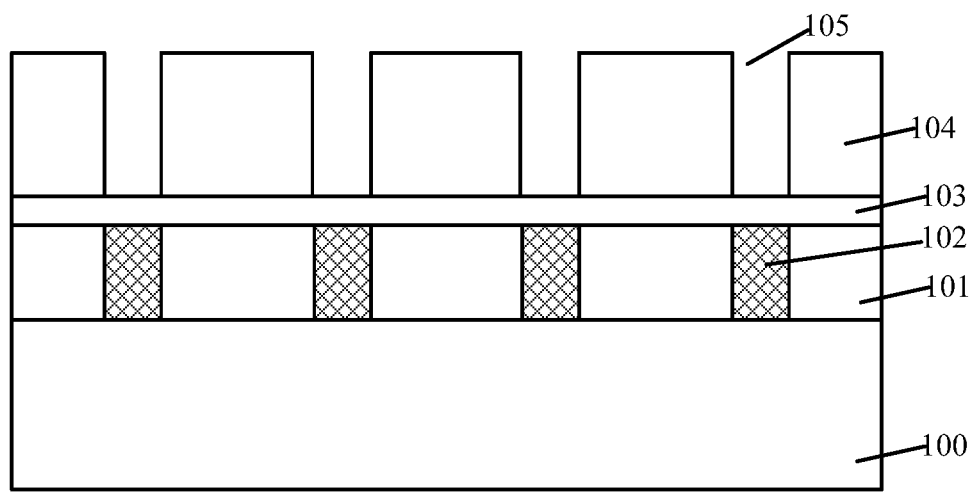
Figure 3:
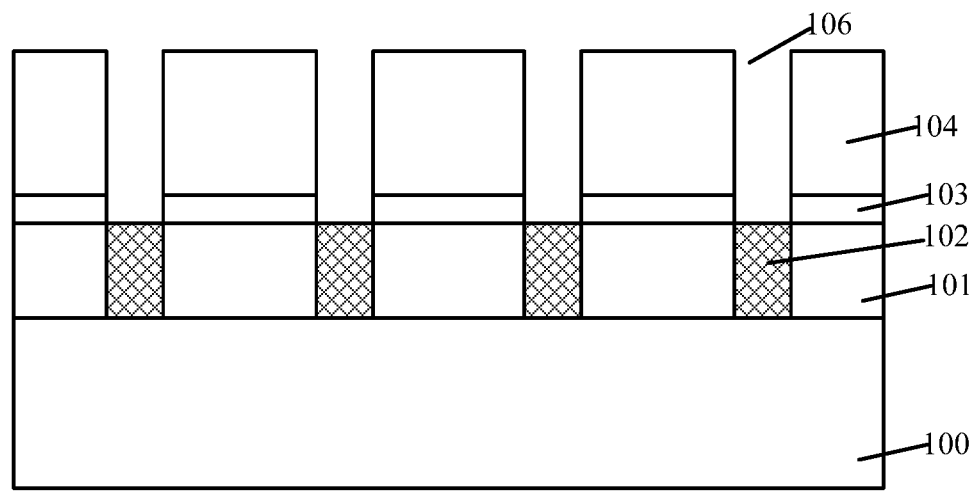

FIG. 1 to FIG. 3 illustrate schematic cross-sectional views of semiconductor structures at certain stages of a fabrication process of a semiconductor structure.

As shown in FIG. 1, a substrate is provided. The substrate includes a base substrate 100, an isolation layer 101 formed on the base substrate 100, and a plurality of interconnection structures 102 formed in the isolation layer 101. A stop layer 103 is formed over the substrate. A dielectric layer 104 is formed over the stop layer 103.

Referring to FIG. 2, a plurality of first openings 105 is formed in the dielectric layer 104. The plurality of first openings 105 exposes the stop layer 103.

Referring to FIG. 3, the portion of the stop layer 103 exposed at the bottom of each first opening 105 is removed to form a second opening 106. The second opening 106 exposes an interconnection structure 102.

During the fabrication process of the semiconductor structure, the portion of the stop layer 103 located at the bottom of the first opening 105 is removed by a wet etching process after the first opening 105 is formed. Since the wet etching process has an isotropic etching effect, when the stop layer 103 at the bottom of the first opening 105 is removed to form the second opening 106, the stop layer 103 on the sidewall of the second opening 106 is inevitably etched sideways, which may damage or even etch laterally through the stop layer 103 formed over the substrate surface between adjacent interconnection structures 102. Therefore, after a conducting plug is subsequently formed in each second opening 106 and electrically connected to the interconnection structure 102, adjacent conductive plugs may be easily connected to each other, leading to short circuit and leakage. As such, the performance of the semiconductor structure may be degraded.

The present disclosure provides a semiconductor structure and a method for forming the semiconductor structure. A modification layer is formed by modifying the stop layer at the bottom of the first opening. The modification layer is made of a material having a high etching selectivity ratio as compared to the material for forming the stop layer. Thus, when removing the modification layer to form the second opening, the etching process may cause less damage to the stop layer on the sidewall of the second opening. As such, short-circuit and leakage of the conductive plug formed subsequently in the second opening may be avoided, and the performance of the semiconductor structure may be improved.

To make the aforementioned objectives, features, and beneficial effects of the present disclosure more comprehensible, specific embodiments of the present disclosure are described in detail below with reference to the accompanying drawings.

Figure 9:
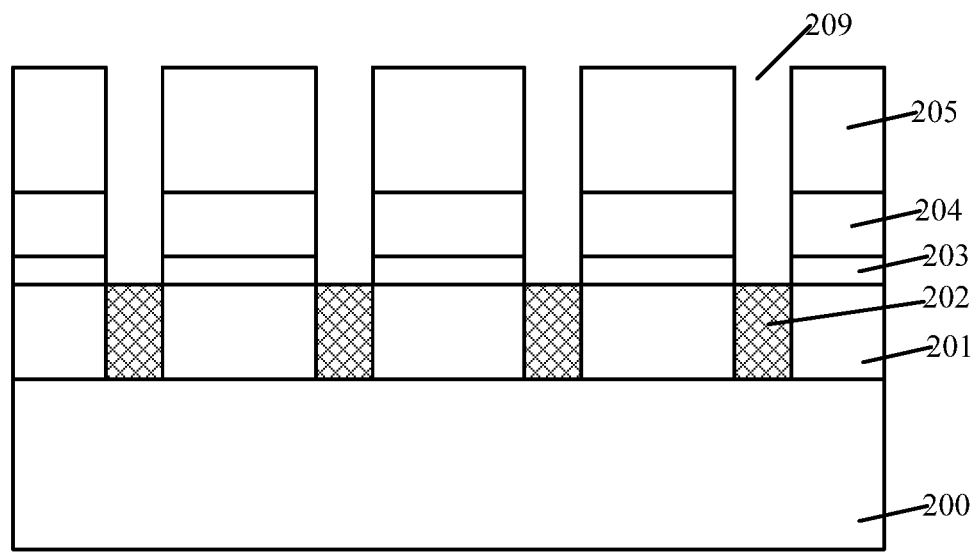
Figure 10:
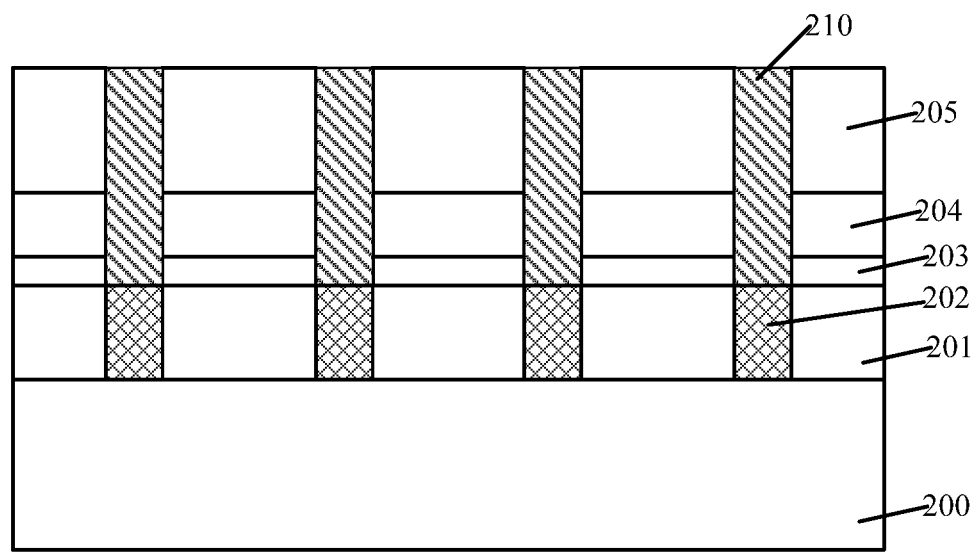
Figure 11:
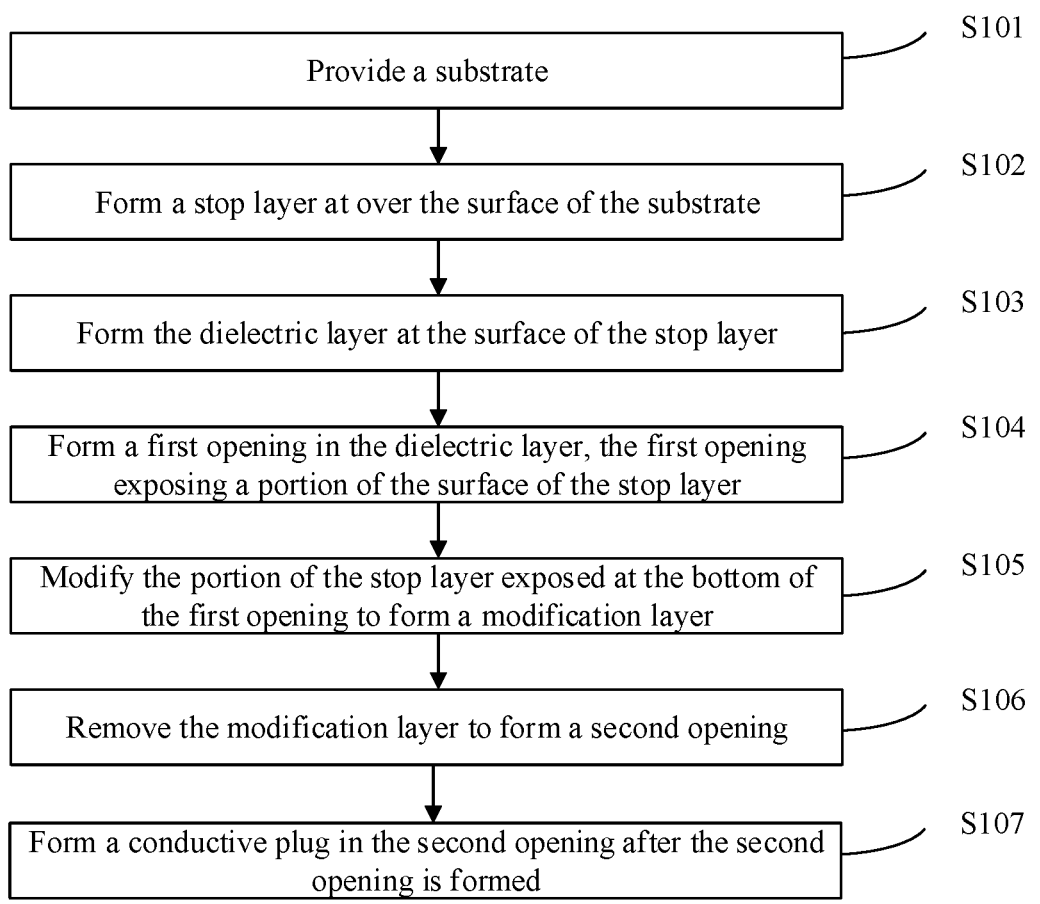
FIG. 11 illustrates a flowchart of an exemplary method for forming a semiconductor structure according to some embodiments in the present disclosure.

FIG. 11 illustrates a flowchart of an exemplary method for forming a semiconductor structure according to some embodiments in the present disclosure. FIG. 4 to FIG. 10 illustrate schematic cross-sectional views of semiconductor structures at certain stages of the exemplary fabrication method.

Figure 4:
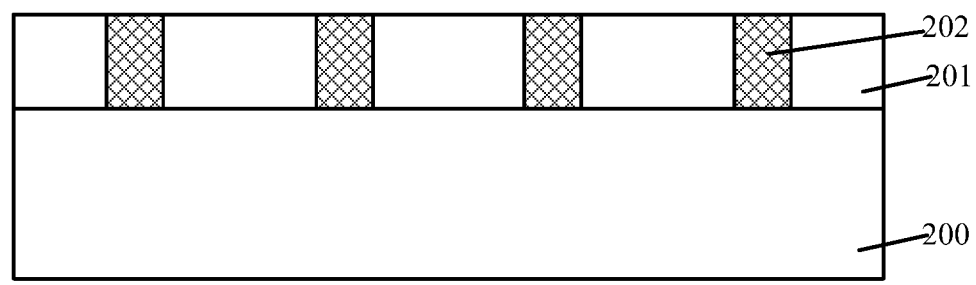
FIG. 4 to FIG. 10 illustrate schematic cross-sectional views of semiconductor structures at certain stages of an exemplary method for fabricating a semiconductor structure according to some embodiments in the present disclosure.

Referring to FIG. 11, in S101, a substrate may be provided. FIG. 4 illustrates a schematic cross-sectional view of a semiconductor structure according to some embodiments of the present disclosure.

Referring to FIG. 4, a substrate may be provided. In one embodiment, the substrate may include a base substrate 200, and an isolation layer 201 formed on the base substrate 200.

In other embodiments, the substrate may include a base substrate, an isolation layer formed on the base substrate, a plurality of device structures, conductive wiring, a plurality of metal layers, or a plurality of conductive layers located in the isolation layer.

The isolation layer 201 may include a plurality of interconnection structures 202. The isolation layer 201 may expose a portion of each interconnection structure 202. In some embodiments, the interconnection structure 202 may be configured to be electrically connected to other interconnection structures. The other interconnection structures may include, for example, conductive plugs.

In other embodiments, the plurality of interconnection structures may be electrically connected to the plurality of device structures, the conductive wiring, the plurality of layers, or the plurality of conductive layers. The plurality of device structures may include transistors, diodes, and/or P-N junctions.

In one embodiment, the plurality of interconnection structures 202 may be made of a material including a metal. The metal may include copper, tungsten, cobalt, ruthenium, or a combination thereof.

A conductive plug may be subsequently formed over each interconnection structure 202. The interconnection structure 202 may be electrically connected to other devices through the conductive plug.

In other embodiments, the plurality of interconnection structures may be made of a material including metal silicide. The metal silicide may include titanium silicide, zirconium silicide, tantalum silicide, tungsten silicide, or a combination thereof.

The isolation layer 201 may be made of a material including silicon oxide or silicon nitride. In one embodiment, the isolation layer 201 may be made of a material including silicon oxide.

The base substrate 200 may be made of a material including silicon. In other embodiments, the base substrate 200 may be made of a material including germanium, silicon germanium, silicon carbide, gallium arsenide, indium gallium, or the like.

Figure 5:
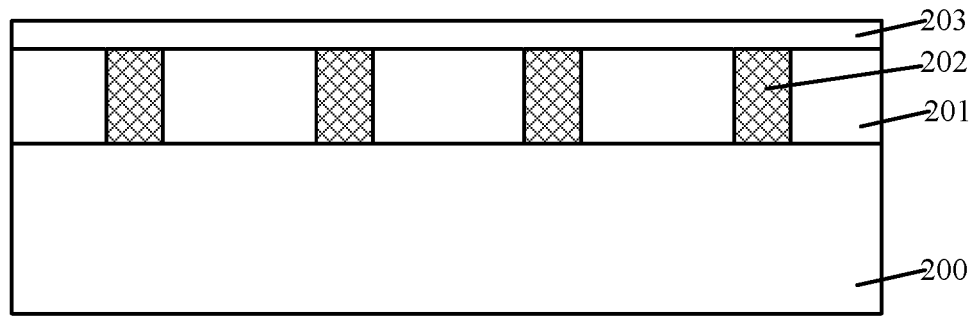

Further, returning to FIG. 11, in S102, a stop layer may be formed on the substrate. FIG. 5 illustrates a schematic cross-sectional view of a semiconductor structure according to some embodiments of the present disclosure.

Referring to FIG. 5, a stop layer 203 may be formed on the substrate. The stop layer 203 may be used as an etching stop layer when an opening is subsequently formed in a dielectric layer formed over the substrate. The stop layer 203 may be able to prevent the opening from directly exposing the interconnection structure 202, thereby preventing the interconnection structure 202 from being damaged.

The process for forming the stop layer 203 may include a chemical vapor deposition (CVD) process, a physical vapor deposition (PVD) process, or an atomic layer deposition (ALD) process.

In one embodiment, the stop layer 203 may be formed by a CVD process. The CVD process may be able to efficiently form the stop layer 203 with a dense structure.

The stop layer 203 may be made of a material including aluminum nitride, aluminum oxide, or silicon nitride. In one embodiment, the stop layer 203 may be made of a material including aluminum nitride.

Aluminum nitride may be used as a stop layer when etching a first dielectric layer and a second dielectric layer in a subsequent process to form a first opening. Because aluminum nitride has an etching selectivity ratio different from that of the first dielectric layer, aluminum nitride may be used as the stop layer to control the etching process of the first dielectric layer. In addition, aluminum nitride is a non-conductive material and may provide electrical isolation for the plurality of interconnection structures 202 located at the bottom of the first opening, and thus prevent adjacent interconnection structures 202 from being connected with each other through the stop layer 203 and further affecting the performance of the semiconductor structure.

The thickness of the stop layer 203 may not be too large or too small. For example, when the thickness of the stop layer 203 is less than 1 nm, the stop effect of the stop layer 203 in the etching process may be insufficient. However, when the thickness of the stop layer 203 is thicker than 5 nm, due to the limited penetration depth of the modification gas during the subsequent modification process, the stop layer may not be completely modified. Therefore, in one embodiment, the thickness of the stop layer 203 ranges from about 1 nm to 5 nm.

Figure 6:
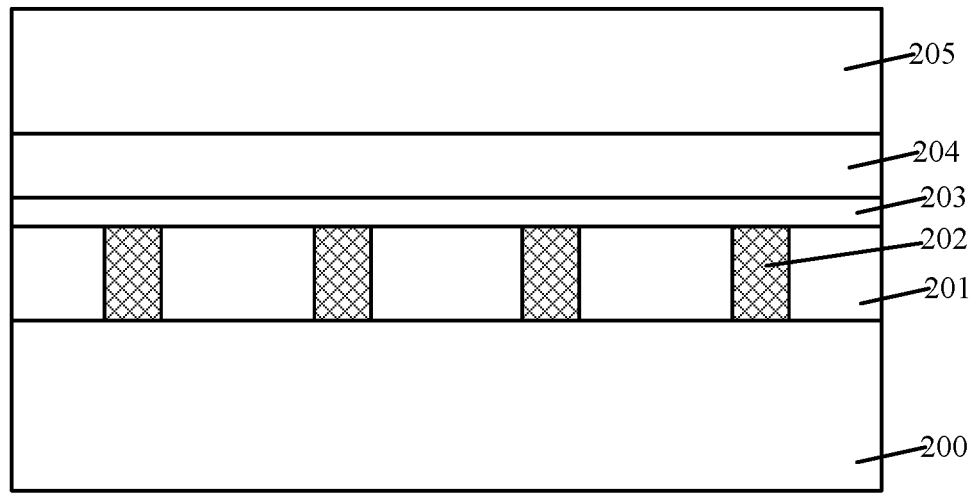

Further, returning to FIG. 11, in S103, a dielectric layer may be formed on the stop layer. FIG. 6 illustrates a schematic cross-sectional view of a semiconductor structure according to some embodiments of the present disclosure.

Referring to FIG. 6, a dielectric layer (not labeled) may be formed on the stop layer 203. The dielectric layer may be configured to provide structural support during subsequent formation of conductive plugs in a plurality of second openings. In the meantime, the dielectric layer may also be used to isolate the subsequently-formed conductive plugs, thereby preventing adjacent conductive plugs from forming short circuits and thus degrading the performance of the semiconductor structure.

In one embodiment, the dielectric layer may include a first dielectric layer 204 disposed on the first stop layer 203 and a second dielectric layer 205 disposed on the first dielectric layer 204. The first dielectric layer 204 and the second dielectric layer 205 may be formed over the stop layer 203. The first dielectric layer 204 and the second dielectric layer 205 may be made of different materials. The material structure of the first dielectric layer 204 is relatively dense. Therefore, when forming an opening in the first dielectric layer 204, the sidewall of the opening may be relatively straight (e.g., the sidewall of the formed opening may be perpendicular to the substrate as desired), and the pattern obtained after for forming the opening may be more accurate. As such, the conductive plug subsequently formed in the opening may have a large contact surface with the interconnection structure 202, and thus the conductivity may be desired.

The first dielectric layer 204 may be made of a material including silicon oxide, silicon nitride, silicon, or a combination thereof. The second dielectric layer 205 may be made of a material including silicon oxide, silicon nitride, silicon, or a combination thereof.

In one embodiment, the first dielectric layer 204 and the second dielectric layer 205 may be made of different materials. For example, the first dielectric layer 204 may be made of a material including silicon nitride, and the second dielectric layer 205 may be made of a material including silicon oxide.

The process for forming first dielectric layer 204 may include a CVD process, a PVD process, or an ALD process. In one embodiment, the first dielectric layer 204 may be formed by a CVD process.

The process for forming the second dielectric layer 205 may include a CVD process, a PVD process, or an ALD process. In one embodiment, the second dielectric layer 205 may be formed by a CVD process.

In other embodiments, the first dielectric layer and the second dielectric layer may be made of a same material. However, the process for forming the first dielectric layer may be different from the process for forming the second dielectric layer. For example, the first dielectric layer 204 and the second dielectric layer 205 may be made of a material including silicon oxide, silicon nitride, or silicon; the first dielectric layer 204 may be formed by an ALD process; and the second dielectric layer 205 may be formed by a CVD process or a PVD process.

Compared to the CVD process, the ALD process may be able to form silicon oxide or silicon nitride with a denser structure.

In other embodiments, when the stop layer is made of a material including silicon nitride, the first dielectric layer and the second dielectric layer may be made of a same material. For example, the first dielectric layer and the second dielectric layer may both be made of a material including silicon.

The stop layer may be made of silicon nitride, and in a subsequent process, the material of a portion of the stop layer may be modified from silicon nitride to silicon oxide. Silicon oxide has a higher etching selectivity ratio over silicon nitride, and silicon oxide has a higher etching selectivity ratio over silicon. Therefore, during the removal of the modified layer, the stop layer and the dielectric layer may be subjected to less damage. As such, after the modified layer is completely removed, the stop layer and the dielectric layer may be lightly removed, e.g., each of the stop layer and the dielectric layer may remain substantially the same as that prior to the removal of the modified layer.

Figure 7:
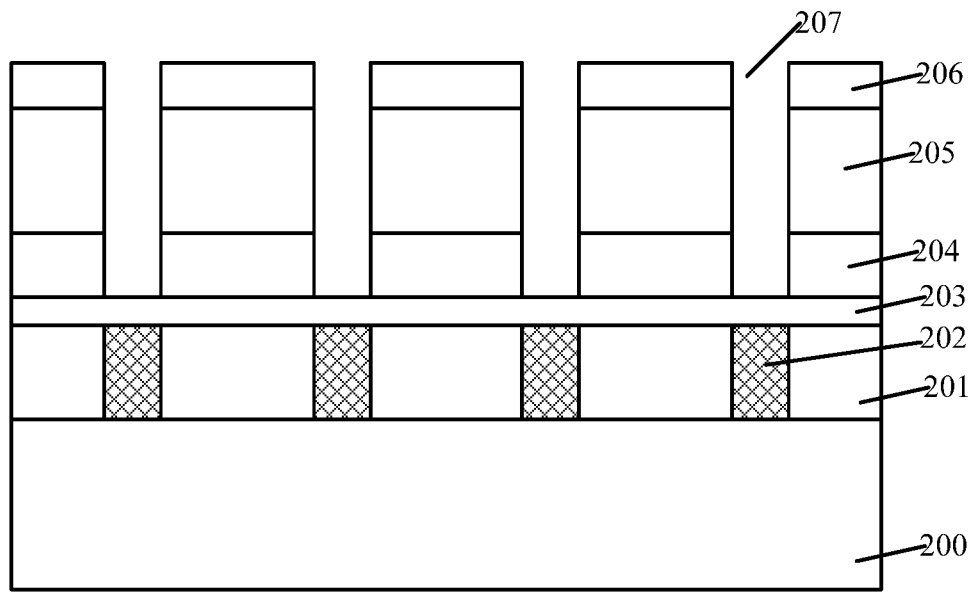

Returning to FIG. 11, in S104, a plurality of first openings may be formed in the dielectric layer, and each first opening may expose the stop layer. FIG. 7 illustrates a schematic cross-sectional view of a semiconductor structure according to some embodiments of the present disclosure.

Referring to FIG. 7, a plurality of first openings 207 may be formed in the dielectric layer, and each of the plurality of first openings 207 may expose the stop layer 203.

The process of forming the plurality of first openings 207 in the first dielectric layer 204 and the second dielectric layer 205 may include the following exemplary steps. A patterned mask layer 206 may be formed over the second dielectric layer 205 first. The patterned mask layer 206 may expose a portion of the second dielectric layer 205 and define the position of the plurality of first openings 207. Further, the second dielectric layer 205 and the first dielectric layer 204 may be etched using the patterned mask layer 206 as an etch mask until the stop layer 203 is exposed. As such, the plurality of first opening 207 may be formed.

In one embodiment, the second dielectric layer 205 and the first dielectric layer 204 may be etched through a dry etching process. In other embodiments, the second dielectric layer and the first dielectric layer may be etched through a wet etching process.

In one embodiment, the patterned mask layer 206 may be made of a material including a photoresist. In other embodiments, the patterned mask layer 206 may be a hard mask layer, and thus made of a hard material.

The patterned mask layer 206 may be removed after the plurality of first openings 207 is formed. In one embodiment, the patterned mask layer 206 may be removed by an ashing process.

Figure 8:
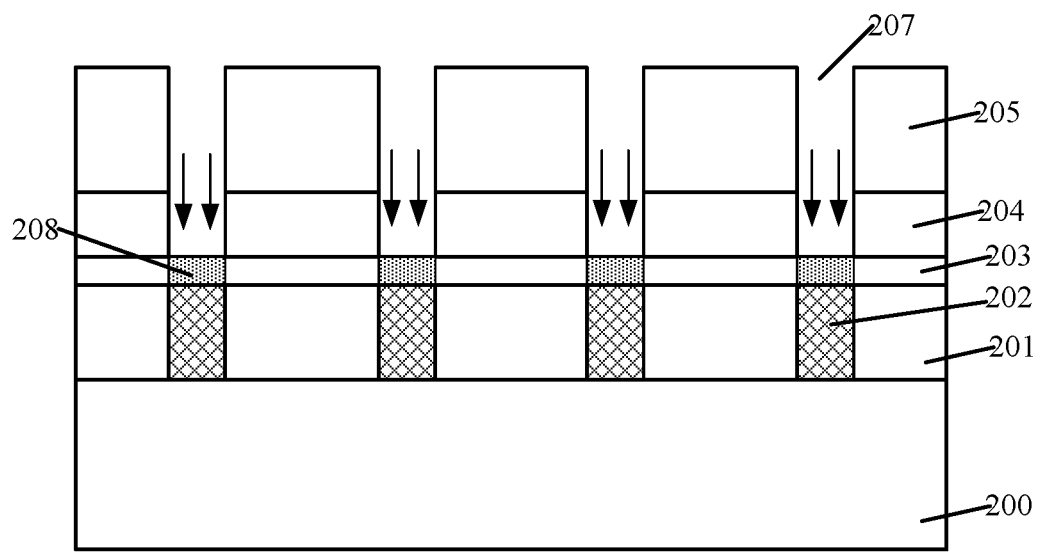

Further, returning to FIG. 11, in S105, the stop layer at the bottom of the first opening may be modified to form a modification layer. FIG. 8 illustrates a schematic cross-sectional view of a semiconductor structure according to some embodiments of the present disclosure.

Referring to FIG. 8, the portion of the stop layer 203 located at the bottom of the first opening 207 may be modified to form a modification layer 208. The modification layer 208 may have a higher etching selectivity ratio over the stop layer 203. When the modification layer 208 is subsequently removed to expose the plurality of interconnection structures 202, damage to the stop layer 203 on the sidewall of the modification layer 208 during the removal of the modification layer 208 may be limited, and thus the stop layer 203 on the sidewall of the modification layer 208 may substantially remain unchanged. As such, over-etching of the stop layer 203 may be prevented and short circuits formed between subsequently-formed conductive plugs may be avoided.

In one embodiment, the modification layer 208 may be made of a material including aluminum. In other embodiments, the modification layer may be made of a material including silicon oxide.

In one embodiment, a plasma processing process may be performed to modify the portion of the stop layer 203 exposed by the plurality of first openings 207.

In one embodiment, the stop layer 203 may be made of a material including aluminum nitride. A processing gas used in the plasma processing process may include a mixed gas of hydrogen and an inert gas. The inert gas may include argon or helium, and the volume ratio of the hydrogen in the mixed gas may be greater than approximately 20%.

Hydrogen is a reaction gas that can chemically react with aluminum nitride to generate aluminum (metal) and ammonia (gas). Ammonia is a gas that can be discharged together with the reaction gas. Aluminum nitride may be modified into aluminum by contacting with the plasma. Aluminum has a higher etching selectivity ratio over aluminum nitride. Thus, when the modification layer 208 made of aluminum is subsequently removed to form a plurality of second openings, the aluminum-removal process may cause limited damage to the stop layer 203 on the sidewalls of each second opening. As such, short circuit and leakage may be avoided after a plurality of conductive plugs is formed in the second openings. Therefore, the performance of the semiconductor structure may be improved.

The inert gas may be easily ionized to generate electrons, such that electrons may be provided for the reaction. In the meantime, the inert gas may maintain a stable gas pressure in the reaction chamber without involving in any chemical reaction.

In other embodiments, the processing gas used in the plasma processing process may include oxygen when the material for forming the stop layer includes silicon nitride. Oxygen reacts with silicon nitride to form a silicon-oxide modified layer and nitrogen dioxide ($NO_2$). Nitrogen dioxide is a gas that can be discharged together with the reaction gas. The silicon-oxide modified layer may have a higher etching selectivity ratio over the stop layer that is made of silicon nitride.

Further, returning to FIG. 11, in S106, the modification layer may be removed to form a plurality of second openings. FIG. 9 illustrates a schematic cross-sectional view of a semiconductor structure according to some embodiments of the present disclosure.

Referring to FIG. 9, the modification layer 208 may be removed to form a plurality of second openings 209, and each second opening 209 may expose the substrate.

In one embodiment, each second opening 209 may expose an interconnection structure 202. The second opening 209 may be used to subsequently form a conductive plug in the second opening 209. The conductive plug may be electrically connected to the interconnection structure 202 at the bottom of the second opening 209.

In embodiment, the modification layer 208 may be removed by a wet etching process. The processing parameters used in the wet etching may include a processing solution including a hydroxylamine solution, and a processing temperature in a range of approximately 0° C. to 40° C.

The hydroxylamine solution may cause a higher etch selectivity ratio for aluminum over aluminum nitride at a temperature in a range between 0° C. and 40° C. Therefore, using the hydroxylamine solution may reduce the damage to the stop layer 203 on the sidewall of the second opening 209 when removing the modification layer 208. In the meantime, the hydroxylamine solution may have a higher etching selectivity ratio on the modification layer 208 over the interconnection structure 202. Therefore, using the hydroxylamine solution may reduce the damage to the interconnection structure 202 when the modification layer 208 is completely removed. As such, the performance of the semiconductor structure may be improved.

The processing temperature may not be too high. For example, when the temperature of the hydroxylamine solution is higher than 40° C., the reaction temperature is too high, and as a result, aluminum nitride may easily hydrolyze under the temperature condition to produce aluminum hydroxide which reacts with the hydroxylamine solution. As such, the stop layer on the sidewall of the second opening 209 may be damaged when the modified layer 208 is removed. Therefore, the objectives of the technical solution of the present disclosure cannot be achieved.

In other embodiments, the stop layer may be made of a material including silicon nitride, the modification layer may be made of a material including silicon oxide, and the first dielectric layer and the second dielectric layer may be made of a material including silicon. Accordingly, the processing solution used in the wet etching process may include a hydrogen fluoride solution.

The hydrogen fluoride solution may have a higher etching selectivity ratio on silicon oxide over silicon nitride. The hydrogen fluoride solution may have a higher etching selectivity ratio on silicon oxide over silicon. Therefore, using the hydrogen fluoride solution may reduce the damage to the stop layer on the sidewall of the second opening and also reduce the damage to the dielectric layer when removing the modification layer.

Further, returning to FIG. 11, in S107, after the second opening is formed, a conductive plug may be formed in each second opening. FIG. 10 illustrates a schematic cross-sectional view of a semiconductor structure according to some embodiments of the present disclosure.

Referring to FIG. 10, after the plurality of second openings 209 (referring to FIG. 9) is formed, a conductive plug 210 may be formed in each second opening 209.

The process of forming the conductive plug 210 may include forming a conductive plug material layer (not shown) in each second opening 209 and over the second dielectric layer 205, and planarizing the conductive plug material layer until the second dielectric layer 205 is exposed. As such, a conductive plug 210 may be formed in each second opening 209.

The conductive plug 210 may be made of a material including copper, tungsten, aluminum, titanium, titanium nitride, tantalum, or a combination thereof. In one embodiment, the conductive plug 210 may be made of a material including titanium or titanium nitride.

In one embodiment, the conductive plug material layer may be formed by a deposition process. In other embodiments, the conductive plug material layer may be formed by an electroplating process. In one embodiment, the conductive plug material layer may be planarized by a chemical mechanical polishing (CMP) process.

In one embodiment, the conductive plug 210 may be electrically connected to an interconnection structure 202 located under the conductive plug 210. The formed conductive plug 210 may have a large contact area with the interconnection structure 202 and thus may have desired electrical connection. In the meantime, the short-circuit effect may be reduced, and the performance of the semiconductor structure may be improved.

Correspondingly, some embodiments of the present disclosure also provide a semiconductor structure formed by a method consistent with various embodiments of the present disclosure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor structure, comprising:
   providing a substrate, wherein the substrate includes a base substrate, an isolation layer disposed over the base substrate, and an interconnection structure over the base substrate filling up through-holes in the isolation layer;
   forming a stop layer over the substrate;
   forming a dielectric layer over the stop layer;
   forming a first opening in the dielectric layer, the first opening exposing a portion of the stop layer;
   modifying the portion of the stop layer exposed at a bottom of the first opening to form a modification layer, wherein the stop layer is made of a material of aluminum nitride and the portion of the stop layer is modified from a material of aluminum nitride to a material of aluminum; and
   removing the modification layer to form a second opening from the first opening.

2. The method according to claim 1, wherein:
   a plasma processing process is performed to modify the portion of the stop layer exposed at the bottom of the first opening.

3. The method according to claim 2, wherein:
   a processing gas used in the plasma processing process includes a mixed gas of hydrogen and argon, wherein:
      a volume ratio of hydrogen in the processing gas is greater than 20%; or
   the processing gas used in the plasma processing process is oxygen.

4. The method according to claim 1, wherein:
   the modification layer is removed by a wet etching process; and
   an etching solution used in the wet etching process includes a hydroxylamine solution or a hydrogen fluoride solution.

5. The method according to claim 1, wherein:
   the isolation layer exposes a portion of the interconnection structure.

6. The method according to claim 5, wherein the second opening exposes the interconnection structure.

7. The method according to claim 5, wherein:
   the interconnection structure is made of a material including a metal; and
   the metal includes copper, tungsten, cobalt, ruthenium, or a combination thereof.

8. The method according to claim 1, wherein the dielectric layer includes:
   a first dielectric layer located over the stop layer; and
   a second dielectric layer located over the first dielectric layer, wherein the first opening is formed in the second dielectric layer and the first dielectric layer.

9. The method according to claim 8, wherein:
   the first dielectric layer is made of a material including silicon oxide, silicon nitride, or silicon; and
   the second dielectric layer is made of a material including silicon oxide, silicon nitride, or silicon.

10. The method according to claim 8, wherein forming the first opening in the first dielectric layer and the second dielectric layer includes:
    forming a patterned mask layer over the second dielectric layer, the patterned mask layer exposing a portion of the second dielectric layer; and
    forming the first opening by etching the second dielectric layer and the first dielectric layer using the patterned mask layer as an etch mask layer until the stop layer is exposed.

11. The method according to claim 10, wherein:
    a dry etching process is performed to etch the second dielectric layer and the first dielectric layer.

12. The method according to claim 1, further including forming a conductive plug in the second opening.

* * * * *